United States Patent
Foltin et al.

(10) Patent No.: US 6,609,233 B1
(45) Date of Patent: Aug. 19, 2003

(54) LOAD SENSITIVITY MODELING IN A MINIMAL LEVEL SENSITIVE TIMING ABSTRACTION MODEL

(75) Inventors: Martin Foltin, Fort Collins, CO (US); Brian Foutz, Ithaca, NY (US); Sean Tyler, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 28 days.

(21) Appl. No.: 09/927,857

(22) Filed: Aug. 10, 2001

(51) Int. Cl.[7] .............................................. G06F 17/50
(52) U.S. Cl. ............................................ 716/6; 716/18
(58) Field of Search ...................... 716/1–6, 18; 703/19

(56) References Cited

U.S. PATENT DOCUMENTS

| | | | | |
|---|---|---|---|---|
| 4,924,430 A | * | 5/1990 | Zasio et al. ..................... 716/6 |
| 5,426,591 A | | 6/1995 | Ginetti et al. ................ 364/489 |
| 5,475,607 A | * | 12/1995 | Apte et al. ..................... 716/10 |
| 5,651,012 A | * | 7/1997 | Jones, Jr. ....................... 714/724 |
| 5,740,347 A | * | 4/1998 | Avidan ........................... 714/33 |
| 5,812,561 A | * | 9/1998 | Giles et al. ................. 714/726 |
| 6,023,568 A | | 2/2000 | Segal ..................... 395/500.07 |
| 6,173,435 B1 | * | 1/2001 | Dupenloup ................... 716/18 |
| 6,430,731 B1 | * | 8/2002 | Lee et al. ....................... 716/6 |

* cited by examiner

Primary Examiner—Matthew Smith
Assistant Examiner—Paul Dinh

(57) ABSTRACT

A method for improved load sensitivity modeling in a minimal level sensitive timing abstraction model provides for an extension of the timing abstraction model. The timing abstraction model extension improves accuracy of the timing abstraction model by splitting setup/hold check nodes and/or dummy latch nodes at certain input and/or output ports.

18 Claims, 6 Drawing Sheets

LOAD SENSITIVITY MODELING IN A MINIMAL LEVEL SENSITIVE TIMING ABSTRACTION MODEL

CROSS-REFERENCE TO RELATED PATENT APPLICATIONS

This application is related to commonly assigned U.S. patent application Ser. No. 09/927,856, entitled "A Minimal Level Sensitive Timing Representative of a Circuit Path;" U.S. patent application Ser. No. 09/928,16, entitled "A Minimal Level Sensitive Timing Abstraction Model Capable of Being Used in General Static Timing Analysis Tools;" U.S. patent application Ser. No. 09/927,220, entitled "Modeling Circuit Environmental Sensitivity of a Minimal Level Sensitive Timing Abstraction Model;" and U.S. patent application Ser. No. 09/927,204, entitled "Enabling Verification of a Minimal Level Sensitive Timing Abstraction Model."

TECHNICAL FIELD

The technical field relates to timing analysis systems, and, in particular, to static timing analysis of a digital circuit.

BACKGROUND

A wide variety of design verification tools are required to produce a working integrated circuit from a functional specification. These tools analyze different parameters of a circuit design to insure that the circuit will function properly after the circuit is fabricated. One important set of verification tools includes timing analysis tools, which are widely used to predict the performance of very large scale integrated (VLSI) designs. Often, timing analysis determines the best path for a designer to pursue or helps to optimize the overall circuit design. In digital circuits, timing considerations can be critical to proper performance. Timing analysis tools may be either static or dynamic.

Dynamic timing analysis (DTA) tools provide the most detailed and accurate information obtainable concerning the performance of a circuit. With DTA, a design engineer must provide sets of waveforms to simulate the conditions under which a circuit will operate. This type of timing analysis is often generated through simulation of a circuit by simulation programs that operate at the transistor level. Examples of such circuit simulation programs are SPICE by University of California at Berkeley and ASTAP by IBM Corporation. For more information on SPICE, refer to "SPICE2: A Computer Program to Simulate Semiconductor Circuits," by L. W. Nagel, Technical Report ERL-M520, UC-Berkeley, May 1975. These DTA programs typically operate by solving matrix equations relating to the circuit parameters, such as voltages, currents, resistances and capacitances. Additionally, such circuit simulation approaches to performance analysis are pattern dependent, or stated another way, the possible paths and the delays associated with the paths depend upon a state of a controlling mechanism or machine, of the circuit being simulated. Thus, the result of a DTA depends on the particular test pattern, or vector, applied to the circuit.

While such circuit simulation programs and DTA tools provide high accuracy, long simulation times are required because a large number of patterns must be simulated since the best and worst case patterns are not known before the simulation occurs. The number of simulations which must be performed is proportional to $2^n$, where "n" is a number of inputs to the circuit being simulated. Thus, for circuits having a large number of inputs, DTA is not always practical.

Static timing analysis (STA) tools are also widely used to predict the performance of VLSI designs. In STA, a design engineer applies stimulus only at each block input, not at base waveform. Additionally, each signal is assumed to switch independently in each machine cycle, i.e., static timing analyzer is waveform independent and simulates the most critical arrival time at each node in the circuit.

In STA, since only the best and worst possible rising and falling times are computed for each signal in the circuit, such times are typically determined in a single pass through a topologically-sorted circuit. When referring to a topologically-sorted circuit, a signal time associated with each subcircuit of the circuit being tested is determined in a sequential nature. Therefore, the signal time associated with a first subcircuit whose output will be propagated to a second subcircuit must be determined before the signal time associated with the second subcircuit is calculated. Typical static analysis methods are described in "Timing Analysis of Computer Hardware," by Robert B. Hitchcock, Sr., et al., IBM J. Res. Develop., Vol. 26, No. 1, pp. 100–105 (1982).

Timing models used in timing analysis are blocks of computer data that can be used to recreate the timing behavior of an electronic circuit. The size of timing models should be as small as possible for a given complexity of circuit, while maintaining the accuracy of the timing model. In general, a smaller timing model will not only require less space in a computer memory, but also will be faster for a computer to evaluate. Often, timing model accuracy is sacrificed to shrink the timing model and speed its evaluation. This is especially important for large timing models that represent an entire subcircuit of an electronic system.

A popular technique for shrinking a timing model involves creating port-based timing models as opposed to path-based timing models. Port-based timing models analyze an electronic circuit to isolate and maintain only the timing behavior that can be observed at the circuit's connections, often referred to as ports, to surrounding circuits. Any timing behavior of a circuit that is internal to the circuit is discarded, leaving only the information that is essential to verifying the timing behavior of the circuit in the context of surrounding circuits. The port-based timing models have been used in both timing simulation and STA. The timing models are accurate, and generally provide good compression of timing model size.

In port-based timing modeling, the electronic circuit is analyzed to determine the longest time for an electronic signal to pass from each input port to each output port. Often the shortest time is determined as well. An edge triggered latch in the circuit, controlled by a clock signal, acts much like an internal port and is also considered a start point and an end point for electronic signals. At the instant the value of its clock signal changes, the edge triggered latch passes the value of its data signal to its output signal. At other times, the edge triggered latch holds the value of its output signal constant. Analysis is also done to determine the longest time for an electronic signal to pass from each input port to the input signals of each edge triggered latch and from the output signal of each edge triggered latch to each output port.

In true port-based timing models, the internal latch nodes are abstracted away and only the longest time for an electronic signal to arrive at each given output port is calculated. Often the shortest time is calculated as well. The latest (and often also the earliest) allowed time for signal to arrive at each given input port is also calculated. For circuits with edge triggered latches, these calculations are rather simple.

The longest time for a signal to arrive at the output port is the time when the clock signal changes on the edge triggered latch that is connected to the output port by a combinational circuitry, plus the time the signal passes from the latch to the output port. If more edge triggered latches are connected to the output port by a combinational circuitry, the latest signal arrival from all the latches is considered. The latest allowed time for the signal to arrive at the input port is the time when the clock signal changes on the edge triggered latch that is connected to the input port by a combinational circuitry, minus the time the signal passes from the input port to the latch, minus the setup time for the latch (due to the physical characteristics of the latch electronic circuitry, the signal value at the latch input must be stable before the clock signal changes). If more latches are connected to the input port by a combinational circuitry, the latest time for the signal to arrive at the input port is the minimum from the latest times determined for the individual latches as described above. The latch that determines the minimum time is referred to as the most critical latch. PathMill's Black box timing model performs these calculations. However, the calculations become more complicated for circuits that use level triggered latches, and PathMill's Black box cannot model well such circuits.

Many digital circuits use level triggered latches, i.e., transparent latches, in place of edge triggered latches. Like an edge triggered latch, a level triggered latch is controlled by a clock signal. The edge triggered latches are active only at the instant the clock signal changes, while the level triggered latches can be active at any time that the clock signal remains at a high voltage.

The level triggered latches in a circuit can time borrow amongst themselves. Time borrowing is possible when the combinational logic between two latches requires more time than the clock period to compute a stable value. However, if the logic following the second latch requires less than an entire clock period to compute a stable value, then the value computed by the first pair of latches need not become stable until some time after the clock signal goes high. The second set of logic will still have enough time to compute a stable value, even though its calculations did not begin until some time after the clock signal went high. Time borrowing is an essential technique for latch-based design. High performance or custom designed circuits, such as modern CPUs, rely on level triggered latches to take advantage of the time borrowing that helps reach high clock frequencies. Timing models that do not support transparency are inadequate for such designs.

When the clock signal transitions from high to low the level triggered latch latches the input data and holds that value on the output port until the clock transitions back to high again. The input data is fed to the level triggered latch via the latch's data pin. The output of the latch is available on the latch's output pin. The clock signal is connected to the latch using the latch's clock pin.

Due to the physical characteristics of the electronic circuitry from which physical latches are implemented, the transition between when the latch is transparent and when the latch holds its value is not instantaneous. Therefore, the value on the data pin must be available a certain amount of time before the clock signal transitions to a low voltage. This time is called the setup time. Routines that verify that the data is available early enough to meet the setup time are called setup checks and violations are called setup violations. In addition to the setup time, the data value must remain constant for a certain amount of time after the clock transitions to low. This time is called the hold time. Routines that verify that the data is available long enough to meet the hold time are called hold checks and violations are called hold violations. If a setup or a hold violation occurs, the latch might not contain a valid value. Thus, it is important that timing models accurately represent setup and hold times.

In a timing model block for a circuit, a signal arriving at the output ports depends on the signal arrival time at the input ports, referred to as stimulus. In a stimulus dependent timing model, the parameters of the timing model are limited to certain intervals of the arrival times. If the stimulus is outside of the interval, the timing model does not properly represent the circuit and the model needs to be rebuilt each time when the stimulus change. In a stimulus independent timing model, the timing model works irrespective of when the signal arrives at the input ports, i.e., always generating correct arrival at the output port.

Currently available timing models that can be input into general STA tools fall into three categories. PathMill's conventional Black box timing models are port-based and stimulus independent. However, the conventional Black box timing models do not support transparency. PathMill's new transparent Black box timing models are port-based with limited support of transparency. However, the new Transparent Black box timing models are stimulus dependent. Pathmill's Gray box timing models support transparency and are stimulus independent. However, the Gray box timing models are not port-based.

For circuits with level triggered latches, the Transparent Black box timing models are significant improvement over the conventional Black box timing models. The latest allowed time for the signal to arrive at a given input port, i.e., the time before setup violation occurs, is calculated, considering not only the first latch connected to the given input port by a combinational circuitry. The second latch or other sequential element that is connected to the first latch by a combinational circuitry is also considered, as well as the third and any successive latch that may be on a transparent path from the given input port. Considering all latches is important because, in circuits with transparent latches, the second, third, or other latch on the transparent path from an input port may be more critical than the first latch, i.e., the second, third, or other latch determines the latest time on the input port before the setup violation occurs, employing similar calculation procedure as described earlier for the first latch in the conventional Black box timing model. Similarly, the longest time for an electronic signal to arrive at the output port is calculated, considering not only the last latch connected to the output port by a combinational circuitry, but also the previous latch that is connected to the last latch by a combinational circuitry, as well as any earlier latch that may be on a transparent path to the output port.

However, in the Transparent Black box timing model, the signal arrival at the output port on a transparent path is correct only for the input port stimulus that was used to build the model. When the input stimulus changes, the model needs to be rebuilt or the signal arrivals at output ports on transparent paths may be wrong, since the Black box timing model cannot represent the unique clock-controlled connectivity between the input and the output ports on a transparent path. Instead, the output signal arrival time on the most critical transparent path is hard-coded in the model, which makes the model valid only for a particular input stimulus.

PathMill's Gray box timing models support transparency and are stimulus independent. However, Gray box timing models abstract only combinational circuit elements and retain all sequential elements that are represented by internal clock-controlled nodes connected by time-arcs, i.e., not port-based. For blocks with a large number of latches, Gray box timing models have a large number of internal nodes and time-arcs, resulting in a large number of timing checks to be performed and a large number of paths to be traced in a STA run. All timing checks carried out on a lower level. of hierarchy need to be repeated again on higher hierarchy levels, because no sequential nodes are abstracted away when moving from one level of hierarchy to the next level. As a result, the large number of timing checks leads to long STA runtimes and large memory requirements, especially on higher hierarchy levels and full chip levels, which, in turn, results in slow roll-up/roll-down times and a need to manually simplify the timing model so that the STA on larger blocks does not run out of memory.

SUMMARY

A method for providing improved load sensitivity modeling in a minimal level sensitive timing abstraction model modeling includes extracting a plurality of parameters from a circuit that includes an input port and an output port and creating an echo-circuit that represents the plurality of parameters. The echo-circuit includes a check node at the input port and a dummy latch node at the output port, and enables a signal to propagate from the input port to the output port only if the signal arrives at the output port later than a clock signal from a most critical clock element controlling the output port. The method further includes splitting the check node at the input port into multiple check nodes to correspond to multiple input logic elements. Alternatively, the method includes splitting the dummy latch node at the output port into multiple dummy latch nodes to correspond to multiple output logic elements. By splitting the check nodes and/or dummy latch nodes at the input and/or output ports, the method improves accuracy of the timing abstraction model.

DESCRIPTION OF THE DRAWINGS

The preferred embodiments of an improved load sensitivity modeling in a minimal level sensitive timing abstraction model will be described in detail with reference to the following figures, in which like numerals refer to like elements, and wherein.

DETAILED DESCRIPTION

Figure 1:
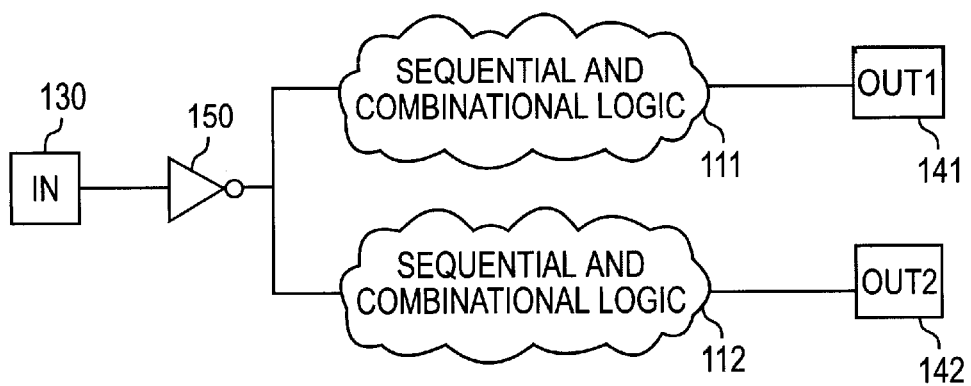
FIG. 1 illustrates a first exemplary circuit with one input, two outputs, and one inverter.

A minimal level sensitive timing abstraction model provides for a minimal representation of a digital circuit block, in the form of an equivalent circuit or connectivity network, with a minimum number of internal nodes. The timing abstraction model supports transparency and can be input into general static timing analysis (STA) tools to efficiently perform timing analysis on large circuits that contain the modeled circuit block. The circuit block represented by the timing abstraction model may contain a combination of sequential and combinational elements, as well as one or more blocks that are themselves this type of timing abstraction model.

The timing abstraction model supports multiple levels of hierarchy and limits timing analysis to most critical paths, i.e., a path from an input port to a setup/hold check node, a path from the input port to a dummy latch node that checks for transparency, a transparent path between the input port and an output port, and a path between a most critical clock element and the output port. The multiple levels of hierarchy leads to a significant reduction of the number of internal clock-controlled nodes, which in turn results in significant speed-up of STA runs on large circuits and reduced memory and storage space requirements. Further speed-up of STA runs is achieved by tracing only the most relevant transparent paths to a given output port, i.e., only the paths on which the signal arrives at the output port later than the clock signal from the most critical clock element, which reduces the number of paths fed to the adjacent blocks. The timing abstraction model also simplifies the output from the timing analysis and may shorten a designer's time to analyze STA results.

A method for improved load sensitivity modeling in the minimal level sensitive timing abstraction model provides for an extension of the timing abstraction model. The timing abstraction model extension improves accuracy of the timing abstraction model by splitting setup/hold check nodes and/or dummy latch nodes at certain input and/or output ports.

The purpose of the timing analysis is to simulate signal arrival times at different nodes in a digital circuit to assure proper functionality of the circuit. Within the circuit are clock-controlled nodes and nodes that are not controlled by clocks. On the clock-controlled nodes, the signal must arrive within a certain time interval relative to the clock. For example, for an edge triggered latch, the signal must arrive at the latch before the active edge of the clock, and for a level triggered latch, the signal must arrive before the closing edge of the clock, i.e., while the latch is open or in an active level. If the signal does not arrive within this timing interval, a violation occurs and the circuit may not function properly. Timing analysis is a computer simulation of the digital circuit to simulate arrival times on the clock-controlled nodes and to verify that the signal arrives at the nodes within the allowed time interval.

A micro chip containing digital circuits may have millions of elements, such as transistors, gates, resistors, and interconnects represented by resistors and capacitors. Simulation and timing analysis on a full chip level is expensive. Accordingly, a common practice is to divide the chip into blocks and conduct timing analysis on each of the blocks individually. The blocks are given the characteristics of the real circuit, by abstracting away unnecessary information from the circuit and characterizing the circuit by a set of useful parameters.

Port-based timing models involve less timing simulation than path-based timing models. In port-based timing models, the number of nodes scales with the number of ports. In path-based timing models, the number of nodes scales with the number of paths, which is significantly more than the number of ports in a circuit. The more nodes there are, the longer the timing checks take. So the number of nodes determines how fast the timing checks are performed. In an embodiment of the timing abstraction model, which is port-based rather than path-based, the number of timing checks to be performed, i.e., the number of parameters, scales with the number of input ports plus the number of input-to-output port pairs that are connected by transparent paths for at least one input stimulus, which is usually much less than the total number of paths in the circuit.

Accordingly, the speed-up of STA runs that uses the timing abstraction model may be achieved as follows. First, the number of timing checks to be performed in most circuits may be reduced to one check for each input port plus one check for each input-to-output port pair that is connected by a transparent path for at least one input stimulus. Second, each timing check may be performed faster in the port-based timing model than in a path-based timing model, because the number of clock controlled internal nodes in the port-based model is small, i.e., in most circuits the number of clock controlled nodes is equal to number of ports. Therefore, a larger part of this port-based model may be stored in the fast computer memory, i.e., the main memory or the very fast microprocessor cache memory, than in the path-based timing models. Third, only the most relevant transparent paths, i.e., paths on which a signal arrives at the output port later than the latest clock signal, are traced to a given output port, reducing the number of paths fed to the adjacent blocks.

Level triggered latches, which support transparency, can be active when any of their clock signals, i.e., clock elements, remain at a high voltage, while edge triggered latches are active only at the instant the clock signals change. Some level triggered latches are active when the clock signals are at low voltage, instead of high voltage, but the processes are the same. The timing abstraction model has level triggered latches. In the discussion that follows, level triggered latches are transparent when the clock signals are high, but as will be apparent to one skilled in the art, the techniques described also apply to latches that pass values when the clock signals are low. Also, the following paragraphs describe modeling of maximum (long) path STAs, i.e., the paths with the latest signal arrival at input and output ports. As will be apparent to one skilled in the art, the techniques described also apply to minimum (short) path STAs, i.e., the paths with the earliest signal arrival at the input and output ports, except that there are no short transparent paths in the circuit.

An embodiment of the timing abstraction model first extracts a minimal set of characteristics, i.e., parameters, from the modeled circuit in order to simulate timing on the circuit. The parameters include: 1) a required time parameter associated with an input port, i.e., the latest time a signal can arrive at the input port before a setup violation would occur in the modeled circuit on some sequential element, i.e., a latch or a domino logic, connected to the input port by a combinational circuitry and/or a circuitry that consists of one or more transparent sequential elements; 2) a valid time parameter associated with an output port, i.e., the latest time the signal from any clock element arrives at the output port; and 3) an input-to-output delay parameter that represents a time delay a signal passes from the input to the output port on a transparent path.

Next, the timing abstraction model creates an echo-circuit that represents the characteristics and can be input into virtually any STA tool. The echo-circuit may be a timing abstraction model represented in PathMill's Gray box format.

The first characteristic to be extracted is a setup/hold check time, referred to as a required time, associated with a setup/hold check node at each input port in the timing abstraction model. Associating timing checks with the input port do not reduce the universality of the timing abstraction model because STA analysis tools support circuits with setup/hold timing checks attached to any node.

STA uses two different simulations. A simulation for maximum paths, i.e., the setup check, determines the latest time a data signal can arrive at the input port before any violation in the modeled circuit will occur. A simulation for minimal paths, i.e., the hold check, determines if the data signal is stable for a long enough time at the input port. The following paragraphs describe the simulation with respect to the maximum path. However, one skilled in the art should appreciate that the minimal path simulation behaves in a similar fashion, except that there are no transparencies in minimal path simulation because there is no input-to-output path.

As described above, the setup check node checks data arrival at the input port with respect to the required time, which is the latest time the data signal can arrive at the input port before any violation would occur in the modeled circuit. In other words, the setup check node checks if the data signal arrives at the input port early enough so that the most critical clock-controlled node of the modeled circuit, i.e., the most critical latch or other sequential element such as the domino logic, will have no violation. The most critical sequential element in the modeled circuit is the sequential element on which the violation occurs with the earliest time arrival at the input port. The most critical path is the one that fails first, and the setup check node checks the required time that corresponds to the time when the failure occurs on the most critical sequential element.

As an example, a circuit with three latches may have the most critical as the second latch. In this example, 800 picoseconds may be required for a signal to propagate from the input port to the second latch, and the signal may be required to be at the second latch at time 1000 picoseconds or earlier. If the signal arrives at the second latch in the modeled circuit at 1000 picoseconds, which is the latest allowed time, there is no violation. On the other hand, if the signal arrives at 1001 picoseconds, a violation occurs. Since 800 picoseconds are required to propagate the signal from the input port to the second latch, the signal must arrive at the input port within 200 picoseconds.

In general, the setup time, SI, at an input port I can be expressed as:

$$SI = \min_j(SI_j) \qquad (1)$$

$$SI_j = SL_j + (Cycle_j - Cycle_o)T - Delay_j, \qquad (2)$$

where $SI_j$ is the latest time a signal can arrive at the input port I before violation would occur on a sequential element, i.e., latch or domino logic, $L_j$ in the modeled circuit, $SL_j$ is the latest time signal can arrive at the sequential element $L_j$ before setup violation would occur on the sequential element, $Cycle_j$ is the clock cycle count on the sequential element $L_j$, $Cycle_o$ is the cycle count on input I (usually $Cycle_o=1$), T is the clock cycle time (the clock period) and $Delay_j$ is the time the signal needs to propagate from the input port I to the sequential element $L_j$.

The setup times $SI_j$ can be obtained, for example, from a Pathmill run with late stimulus at the input port I and a latch_error_recovery feature turned on. The late stimulus is an arbitrarily chosen stimulus, Lstim, that is so late that with a certainty a setup violation will occur on some sequential element in the circuit (usually, Lstim can be any number that is much higher than the clock period T). Then, the setup time $SI_j$ can be expressed as:

$$SI_j = Lstim - \sum_{k=1}^{j-1} Advance_k + Slack_j, \qquad (3)$$

where $Slack_j$ is the timing slack on the sequential element $L_j$ and $Advance_k$ is the timing adjustment introduced by the latch_error_recovery feature on sequential element $L_k$ that is on the path from the input port I to the sequential element $L_j$.

The setup times, $SI_j$, can be obtained from other commercial STA tools in a similar way. For example, the setup times can also be obtained directly from Pathmill's Transparent Black model, if the signal arrival times at output ports are not subjected to any constraints when such model is generated.

The second characteristic to be extracted is an opening time, referred to as a valid time, associated with a dummy latch node attached to each output port. The dummy latch node may be controlled by a derived clock that has an opening edge offset with respect to the opening edge of a clock port. The derived clock typically becomes active at the time corresponding to the latest signal arrival from the clock port to the output port in the modeled circuit. The dummy latch node compares data signal arrival at the output port with the clock signal arrival of the latest clock at the output port. All paths arriving before the latest clock stop at the dummy latch node, i.e., the paths are not transparent and the clock signal goes to the output port instead. If the data signal arrives after the clock signal, the data signal propagates to the output port.

Multiple paths may converge from multiple input ports to one output port, with each path controlled by a different clock. In the timing abstraction model, the dummy latch node enables comparison of the data signal with the latest clock signal. Accordingly, the data signal may be blocked if the signal arrives earlier than any of the clocks converging to the output port. Comparing the paths with the most critical clock significantly reduces the number of paths that arrive at the output port.

In general, the valid time, VO, at an output port O can be expressed as:

$$VO = \max_j (VO_j) \qquad (4)$$

$$VO_j = DO_j - (Cycle_j - 1)T \qquad (5)$$

$$DO_j = DC_j + Delay_j, \qquad (6)$$

where $DO_j$ is the signal arrival time at the output port O from clock port $C_j$, $DC_j$ is the signal arrival at a clock port $C_j$, $Delay_j$ is the time the signal needs to propagate from the clock port $C_j$ to the output port O, $VO_j$ is the time $DO_j$ adjusted to the first clock cycle, $Cycle_j$ is the clock cycle count on the output port O and T is the clock cycle time (the clock period). Note that the valid time VO calculated from equations (4)–(6) is adjusted to be in the first clock cycle. The offset between the clock port $C_j$ and the derived clock controlling the dummy latch node will be set to time $VO-DC_j$. The STA tool will determine whether or not the input signal will pass the dummy latch node in the timing abstraction model based on the valid time and the cycle count on the path from the input port.

The most critical path from clock port to the output port O will have a delay $Delay_{jmax} = DO_{jmax} - DC_{jmax}$, where $DO_{jmax}$ is the signal arrival time at the output port O from the most critical clock port $C_{jmax}$ that determines the valid time according to equation (4).

The clock signal arrival times, $DO_j$ and the clock cycle counts, $Cycle_j$, can be obtained from any commercial STA tool, such as Pathmill. The clock signal arrival times and the clock cycle counts are stimulus independent because the clock signal propagation is independent on input signal arrival times.

The third characteristic to be extracted is an input-to-output delay, i.e., transparent delay arc. The delay exists only if, for some stimulus, the signal propagates transparently between the input port and the output port. The dummy latch node opens at the valid time and closes at the latest possible signal arrival time from an input port that has a timing path to the output port. This time is determined by required times and path delays. Accordingly, the dummy latch node enables a signal to propagate from the input port to the output port only if the signal arrives at the output port later than a clock signal on the most critical clock controlling the dummy latch node. This is acceptable for STA tools because STA only deals with the most critical path, i.e., the most critical arrival at any given node.

Therefore, all inputs that arrive at the output port before the latest clock are blocked by the dummy latch node and will not propagate to the next block. The blocking of early arrived inputs simplifies output from the timing analysis because only the most relevant transparent paths are considered. More importantly, the timing abstraction model reduces the number of paths fed to the adjacent blocks and speeds-up the STA runs, because, by blocking the number of paths that leave the first block, the total number of paths in the circuit may be decreased significantly. In addition, by limiting timing analysis to the most critical paths, the timing abstraction model simplifies the output from the timing analysis and shortens designer's time to analyze STA results because only the paths that are important are printed in the report.

The input-to-output delays can be obtained from any commercial STA tool, such as Pathmill, when the input stimulus is set to the required time, SI, described above. These characteristics, i.e., the required time, the valid time, and the input-to-output delay, may be obtained from STA analysis as discussed above. Compared with Pathmill's Black box and Transparent Black box timing models, the timing abstraction model described above represents each input-to-output transparent path by an equivalent circuit that consists of time-arcs (or connectivity networks) and clock-controlled (dummy latch) nodes to model signal arrivals at the output ports independently on input stimulus. The equivalent circuit may be designed such that the tracing of false non-transparent paths is avoided and the reported transparent paths are limited to those critical paths that may be important for the designer. In other words, the timing abstraction model is input-stimulus independent and needs to be rebuilt only when the clock waveforms change.

In the timing abstraction model, circuits and paths are typically reduced to a minimal representation, where zero delay time arcs are used to include the dependence on load modeling in the timing abstraction model. Each input port typically requires only one setup/hold check node and each output port typically requires only one dummy latch node. However, in certain circumstances, the accuracy of the timing model may be improved by splitting setup/hold check nodes and/or dummy latch nodes at certain input and/or output ports.

An embodiment of the method for improved load sensitivity modeling in the minimal level sensitive timing abstraction model provides for a timing abstraction model extension that enables splitting of setup/hold check nodes and/or dummy latch nodes at input and/or output ports. The method for improved load sensitivity modeling in the timing abstraction model will be described using PathMill's abstraction model as an example. However, one skilled in the art will appreciate that similar procedures may be implemented using other timing model formats, as well as real circuit components when timing analysis techniques do not support timing models.

To incorporate environmental conditions, such as output loading for the circuit and strength of input, zero delay elements may be inserted to input and output ports of the timing abstraction model, producing an improved timing abstraction model that accounts for environmental sensitivity factors while retaining accuracy and efficiency of the timing abstraction model.

In PathMill's abstraction format, the timing dependence on an input delay may be characterized by an input slope delay factor Ks. To incorporate the dependence into the timing abstraction model, the delay due to Ks may be attached to a zero delay time arc connecting the input port with the setup/hold check node. The timing abstraction model extension improves modeling sensitivity by splitting the setup/hold check node to enable more than one Ks factor to be attached to each input port, generating a more accurate timing model. An input $I_{slope}$ is typically calculated at the inputs of the circuit and, along with Ks, influences the circuit delay. For example, a slow signal transition at an input will result in a long delay, whereas a fast signal transition will result in a short delay. The input slope delay factor Ks is used to determine a change in the signal arrival time at the input setup node, i.e., $\Delta t$, which equals $Ks \times I_{slope}$.

Similarly, in PathMill's abstraction format, the timing dependence on the attached output load may be characterized by three variables Res, Rs, and Is. A capacitor $C_{out}$ is typically attached at the output port to influence the delay of the last inverter, i.e., logic element, on the path. For example, an inverter driving a small capacitor may generate a short delay, whereas an inverter driving a large capacitor may produce a longer delay. Similar to Ks, Res is an output delay factor. The change in the arrival time at the output port, i.e., $\Delta t$, equals $Res \times C_{out}$. Rs and Is are output slope factors that involve modification of a slope of a signal arriving at the output port, i.e., the rising to falling time of the signal. The factor Is refers to an intrinsic slope, i.e., slope with zero capacitor attached, whereas Rs refers to changes in the slope due to extra capacitors added at the output port. The slope of the signal that arrive at the output port equals $Is + Rs \times C_{out}$.

FIG. 1 illustrates a first exemplary modeled circuit with an input port In130 connected with two output ports $Out_1$ 141 and $Out_2$ 142 through an inverter 150, i.e., an input logic element, and sequential and combinational logics 111, 112. The inverter 150 is present before the split of the two paths leading to the two output ports $Out_1$ 141 and $Out_2$ 142.

Figure 2:
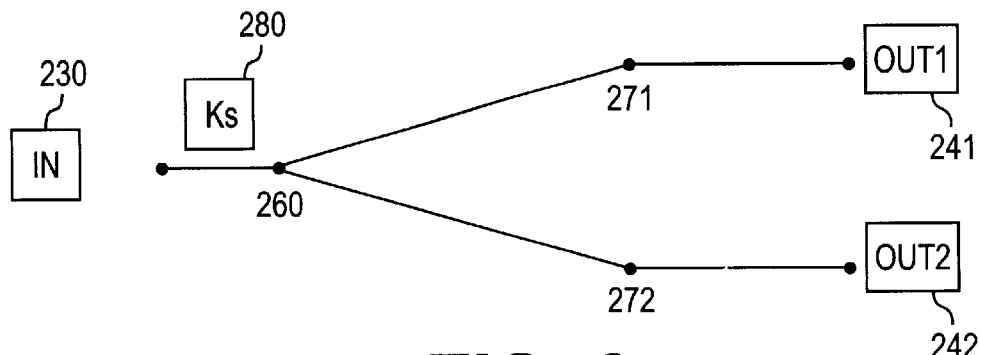
FIG. 2 shows an exemplary timing abstraction model generated from the first exemplary circuit illustrated in FIG. 1.

FIG. 2 shows an exemplary timing abstraction model generated from the first exemplary modeled circuit illustrated in FIG. 1. The exemplary timing abstraction model has an input port In 230 that corresponds to the input port In 130 in the first exemplary modeled circuit, and two output ports $Out_1$ 241 and $Out_2$ 242 that correspond to the two output ports $Out_1$ 141 and $Out_2$ 142 in the first exemplary modeled circuit. Two dummy latch nodes 271, 272 are attached to the two output ports $Out_1$ 241 and $Out_2$ 242, respectively. Since the inverter 150 exists before the split of the two paths in the first exemplary modeled circuit, only one setup/hold check node 260 may be needed to attach to the input port In 230 in the exemplary timing abstraction model. A delay arc with a Ks factor 280, which characterizes an input slope, may be attached between the input port In 230 and the setup/hold check node 260. The exemplary timing abstraction model produces the simplest but less accurate model in representing the first exemplary modeled circuit shown in FIG. 1.

Figure 3:
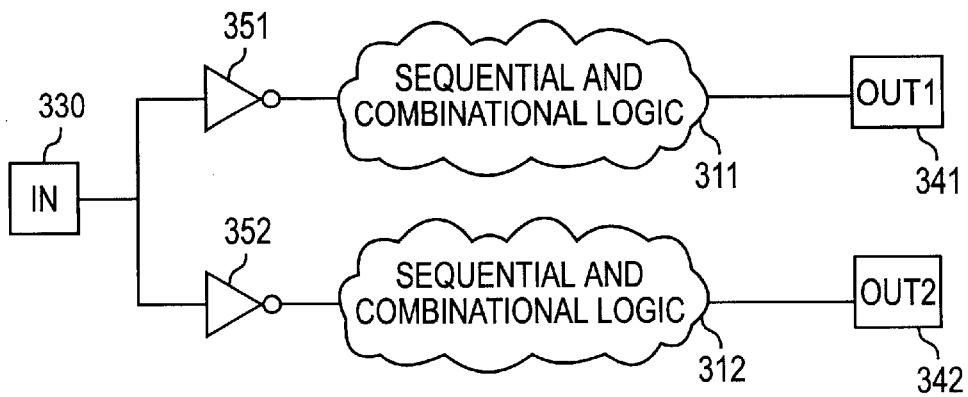
FIG. 3 illustrates a second exemplary circuit with one input, two outputs, and two inverters.

Modeling of environmental sensitivity on an input port is generally not dependent on the path a signal propagates from the input port. In some cases, however, the difference among different paths is significant and worth modeling. For example, FIG. 3 illustrates a second exemplary modeled circuit, which is similar to the first modeled circuit shown in FIG. 1, except with two inverters 351, 352 attached to an input port In 430. In other words, the path split occurs before the inverters 351, 352 in the second exemplary modeled circuit. Two delay paths need to be modeled, In 430→$Out_1$ 341 and In 430→$Out_2$ 342. The circuit delay sensitivity is primarily dependent on the inverter that is part of the path (the inverter 351 for the In 430→$Out_1$ 341 path and the inverter 352 for In 430→$Out_2$ 342 path). For example, if the transistor sizes of the top inverter 351 are larger than the bottom inverter 352, the switching time of the inverter 352 will be faster. Therefore, the input slope sensitivity model may be different depending on which path is taken (the In 430→$Out_1$ 341 path vs. the In 430→$Out_2$ 342 path). The timing abstraction model extension optionally merges the different sensitivity models into a "worst case" value, or splits the setup/hold check nodes and creates a unique timing arc for each path, thereby increasing the accuracy of the timing abstraction model.

Figure 4A:
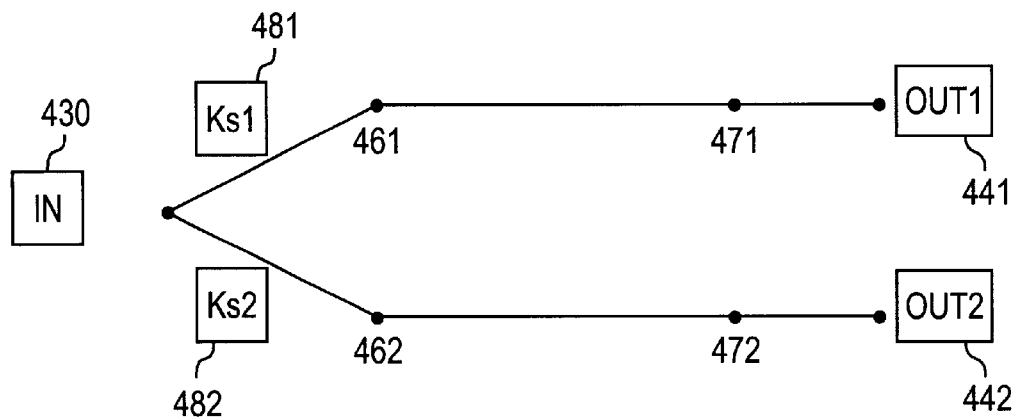
FIGS. 4(a) and 4(b) show exemplary timing abstraction model extensions generated from the second exemplary circuit illustrated in FIG. 3.

FIG. 4(a) shows an exemplary timing abstraction model extension generated from the second exemplary modeled circuit illustrated in FIG. 3. The exemplary timing abstraction model extension has an input port In 430 that corresponds to the input port In 330 in the second exemplary modeled circuit, and two output ports $Out_1$ 441 and $Out_2$ 442 that correspond to the two output ports $Out_1$ 341 and $Out_2$ 342 in the second exemplary modeled circuit. Two dummy latch nodes 471, 472 are attached to the two output ports $Out_1$ 441 and $Out_2$ 442, respectfully. To increase the accuracy of the timing abstraction model, the setup/hold check node may be split into multiple nodes at the input port In 430, i.e., setup/hold nodes 461, 462. In addition, different Ks factors, i.e., $Ks_1$ 481, and $Ks_2$ 482, may be attached to the two setup/hold nodes 461, 462. The exemplary timing abstraction model extension produces a more accurate yet more complicated model for representing the second exemplary modeled circuit. Similarly, if multiple output ports exist in a modeled circuit, multiple Ks factors may be generated.

Figure 4B:
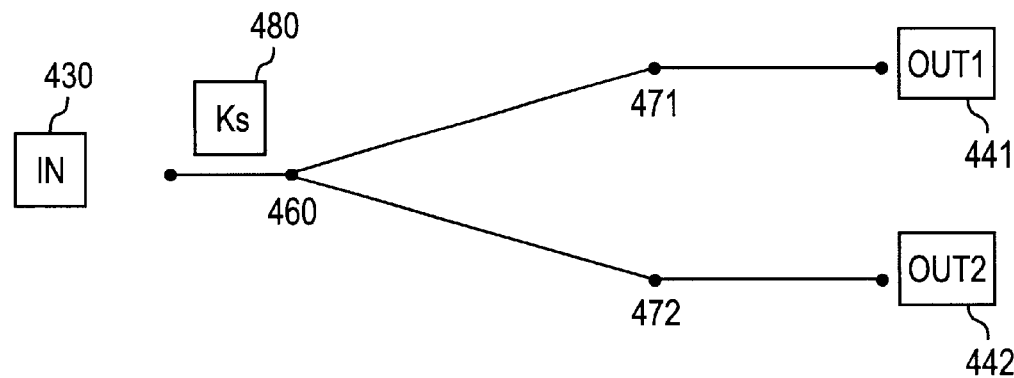

FIG. 4(b) shows another exemplary timing abstraction model extension generated from the second exemplary modeled circuit illustrated in FIG. 3. The exemplary timing abstraction model extension has an input port In 430 that corresponds to the input port In 330 in the second exemplary modeled circuit, and two output ports $Out_1$ 441 and $Out_2$ 442 that correspond to the two output ports Out$_1$ 341 and Out$_2$ 342 in the second exemplary modeled circuit. Two dummy latch nodes 471, 472 are attached to the two output ports Out$_1$ 441 and Out$_2$ 442, respectfully. A single setup/hold check node 460 is placed at the input port In 430. A single Ks factor Ks 480 is calculated by taking the worst, i.e. maximum, Ks value from the different Ks factors, i.e., Ks$_1$ 481, and Ks$_2$ 482, described in FIG. 4(a). The exemplary timing abstraction model extension produces a less complicated but less accurate model for representing the second exemplary modeled circuit.

In the simplest timing abstraction model, such as the exemplary timing abstraction model extension shown in FIG. 4(b), only one Ks factor is used to represent the modeled circuit. In more complicated models, such as the exemplary timing abstraction model extension shown in FIG. 4(a), multiple Ks factors may be attached to multiple setup/hold check nodes for more accurate modeling. The level of accuracy of the timing abstraction model typically depends on the number of splitting performed at the input port and/or the output port.

Accordingly, a decision may need to be made as to whether to use less Ks factors for simplicity or to split the setup/hold check nodes for accuracy. In other words, a trade off exists between the accuracy of the timing abstraction model and the size of the model. In the process of converting modeled circuits into timing abstraction models, a flag may be set by an analyzer, such as "make the model as small as possible," so that no splitting occurs and the timing abstraction model uses, for example, one Ks factor, for each input. On the other hand, a flag may be set as: "make the model as accurate as possible" so that maximum splitting occurs to include multiple Ks factors for each input. In a circuit with over, for example, 64 inputs and 64 outputs, the splitting decision may have a great impact on the size of the timing abstraction models produced.

Figure 5:
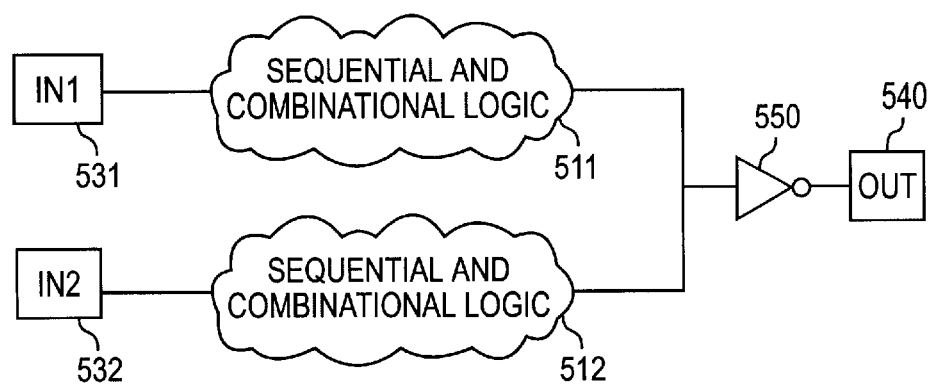
FIG. 5 illustrates a third exemplary circuit with two inputs, one output, and one inverter.

A similar situation may occur at the circuit output ports. FIG. 5 illustrates a third exemplary modeled circuit with two input ports In$_1$ 531 and In$_2$ 532 connected to an output port Out 540 through sequential and combinational logics 511, 512 and an inverter 550, i.e., an output logic element.

Figure 6:
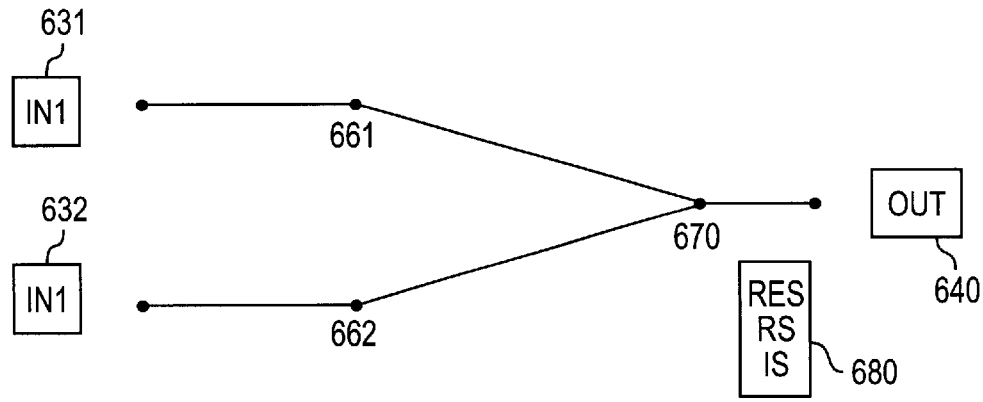
FIG. 6 shows an exemplary timing abstraction model generated from the third exemplary circuit illustrated in FIG. 5.

FIG. 6 shows an exemplary timing abstraction model generated from the third exemplary modeled circuit illustrated in FIG. 5. The exemplary timing abstraction model has two input ports In$_1$ 631 and In$_2$ 632 that correspond to the two input ports In$_1$ 531 and In$_2$ 532 in the third exemplary modeled circuit, and an output port Out 640 that corresponds to the output port Out 540 in the third exemplary modeled circuit. Two setup check nodes 661, 662 are attached to the two input ports In$_1$ 631 and In$_2$ 632. Only one dummy latch node 670 is attached to the output port Out 640. One set of Res, Rs, Is factors 680 representing the delay and the slope of the output.

Figure 7:
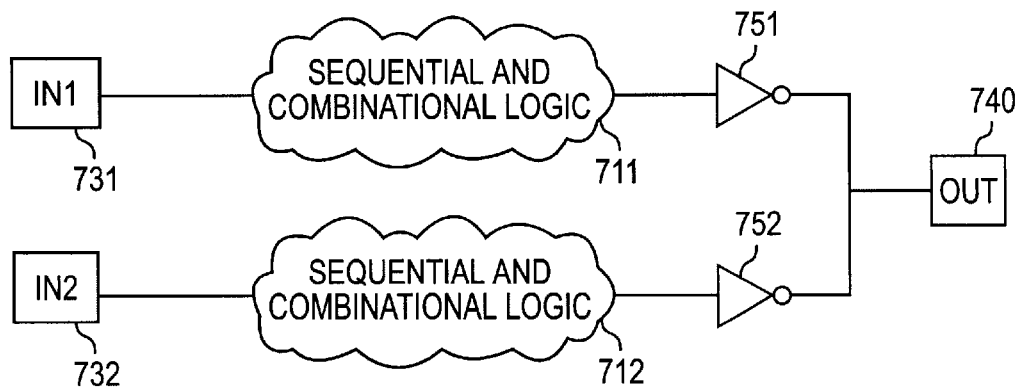
FIG. 7 illustrates a fourth exemplary circuit with two inputs, one output, and two inverters.

FIG. 7 illustrates a fourth exemplary modeled circuit, which is similar to the third modeled circuit shown in FIG. 5, except with two inverters 751, 752 driving an output port Out 740. The output drive strength is primarily determined by the driving inverter that is switching. For example, if the transistor sizes of the top inverter 751 are larger than the bottom inverter 752, the drive strength of an input In$_1$ 731 will be stronger than that of In$_2$ 732. Therefore, the load sensitivity model may be different depending on which path is taken (In$_1$ 731→Out 740 vs. In$_2$ 732→Out 740). The timing abstraction model extension optionally merges the different sensitivity models into a 'worst case' value, or splits dummy latch nodes and creates a unique timing arc for each path, thereby increasing the accuracy of the timing abstraction model.

Figure 8A:
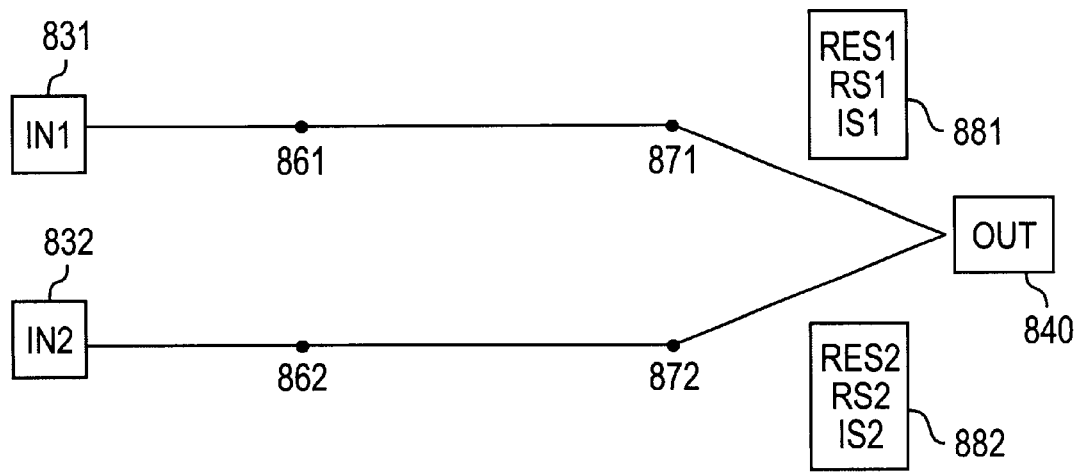
FIGS. 8(a) and 8(b) show exemplary timing abstraction model extensions generated from the fourth exemplary circuit illustrated in FIG. 7.

FIG. 8(a) shows an exemplary timing abstraction model extension generated from the fourth exemplary modeled circuit illustrated in FIG. 7. The exemplary timing abstraction model extension has two input ports In$_1$ 831 and In$_2$ 832 that correspond to the two input ports In$_1$ 731 and In$_2$ 732 in the fourth exemplary modeled circuit, and an output port Out 840 that corresponds to the output port Out 740 in the fourth exemplary modeled circuit. Two setup check nodes 861, 862 are attached to the two input ports In$_1$ 831 and In$_2$ 832. To increase the accuracy of the timing abstraction model, the dummy latch node may be split into multiple nodes at the output port Out 840, i.e., dummy latch nodes 871, 872. In addition, different sets of Res, Rs, Is factors, i.e., Res$_1$, Rs$_1$, Is$_1$ 881 and Res$_2$, Rs$_2$, Is$_2$ 882, may be attached to the two dummy latch nodes 871, 872 to represent the delay and the slope of the output. The exemplary timing abstraction model extension produces a more accurate but more complicated model for representing the fourth exemplary modeled circuit.

Figure 8B:
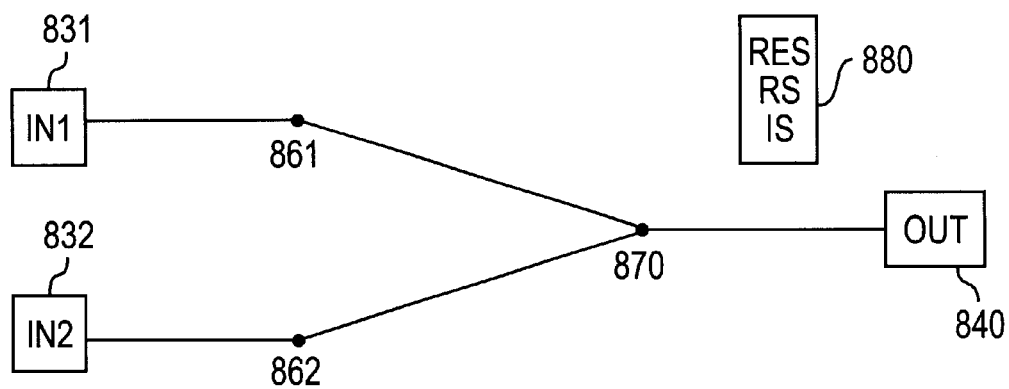

FIG. 8(b) shows another exemplary timing abstraction model extension generated from the fourth exemplary modeled circuit illustrated in FIG. 7. The exemplary timing abstraction model extension has two input ports In$_1$ 831 and In$_2$ 832 that correspond to the two input ports In$_1$ 731 and In$_2$ 732 in the fourth exemplary modeled circuit, and an output port Out 840 that corresponds to the output port Out 740 in the fourth exemplary modeled circuit. The exemplary timing abstraction model has only one dummy latch node 870. A single set of factors are calculated by taking the worst, i.e., maximum, Res, Rs, Is value from the different sets of Res, Rs, Is factors, i.e., Res$_1$, Rs$_1$, Is$_1$ 881 and Res$_2$, Rs$_2$, Is$_2$ 882, as shown in FIG. 8(a). The exemplary timing abstraction model extension produces a less complicated but less accurate model for representing the fourth exemplary modeled circuit.

Figure 9:
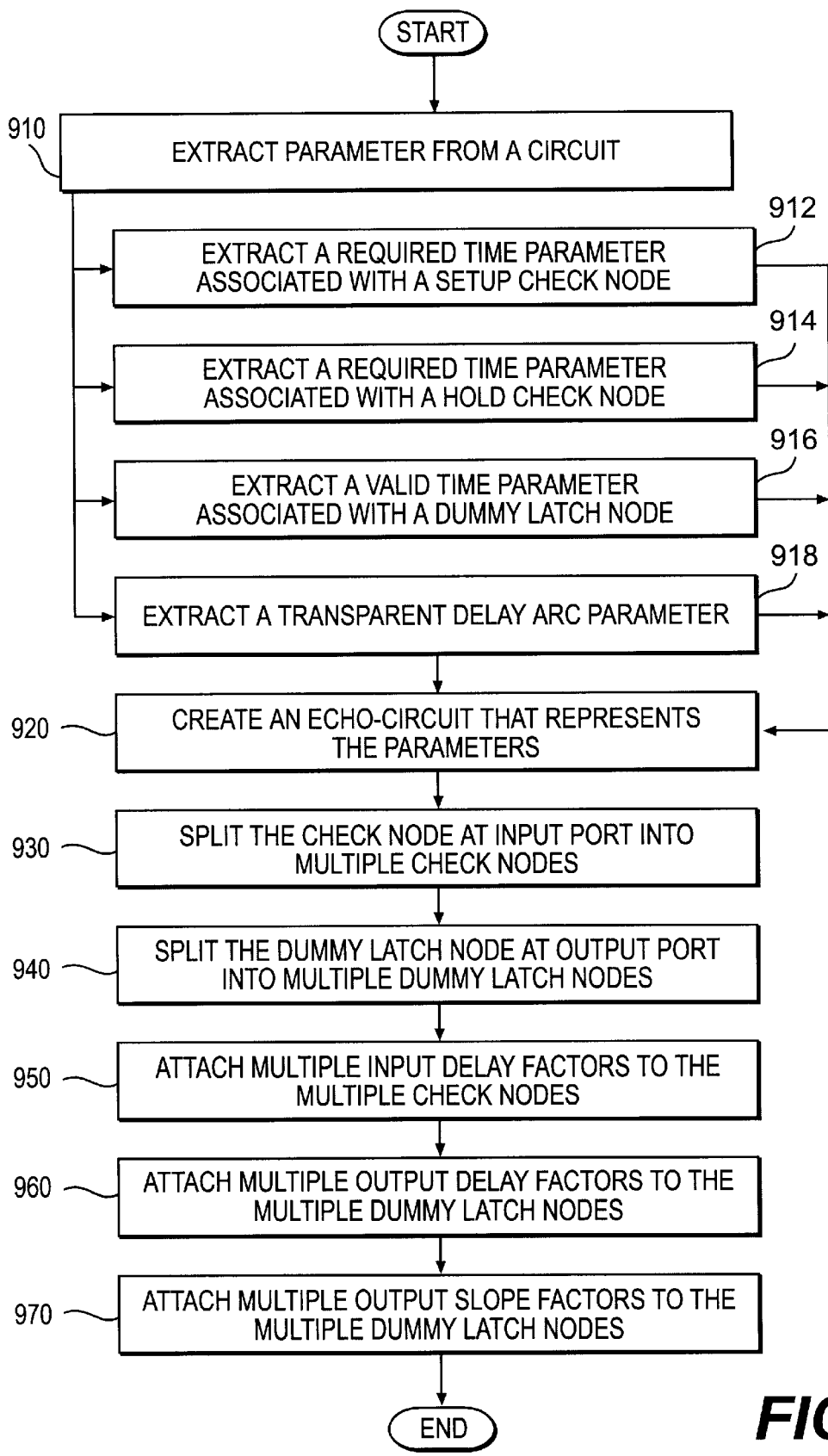
FIG. 9 is a flow chart illustrating an exemplary method for providing improved load sensitivity modeling in an exemplary minimal level sensitive timing abstraction model.

FIG. 9 is a flow chart illustrating an exemplary method for providing improved load sensitivity modeling in an exemplary minimal level sensitive timing abstraction model. First, parameters may be extracted from a circuit that includes sequential elements, such as latches or domino logics, controlled by clock elements, step 910. The parameters to be extracted may include a required time parameter associated with a setup check node, step 912, a required time parameter associated with a hold check node, step 914, a valid time parameter associated with a dummy latch node, step 916, or a transparent delay arc parameter, step 918. Next, an echo-circuit, i.e., a timing abstraction model 100, may be created to represent the parameters, step 920. The echo-circuit may enable a signal to propagate from an input port to an output port only if the signal arrives at the output port later than a clock signal from the most critical clock element controlling the output port.

To improve the accuracy of the timing abstraction model, the exemplary method splits the setup/hold check node at the input port and/or the dummy latch node at the output port into multiple setup/hold check nodes and/or multiple dummy latch nodes, steps 930, 940. Multiple input delay factors, such as Ks, may be attached to the multiple setup/hold check nodes, step 950, whereas multiple output delay factors, such as Res, and output slope factors, such as Rs and Is, may be attached to the multiple dummy latch nodes, steps 960, 970 to generate the improved load sensitivity timing abstraction model.

Figure 10:
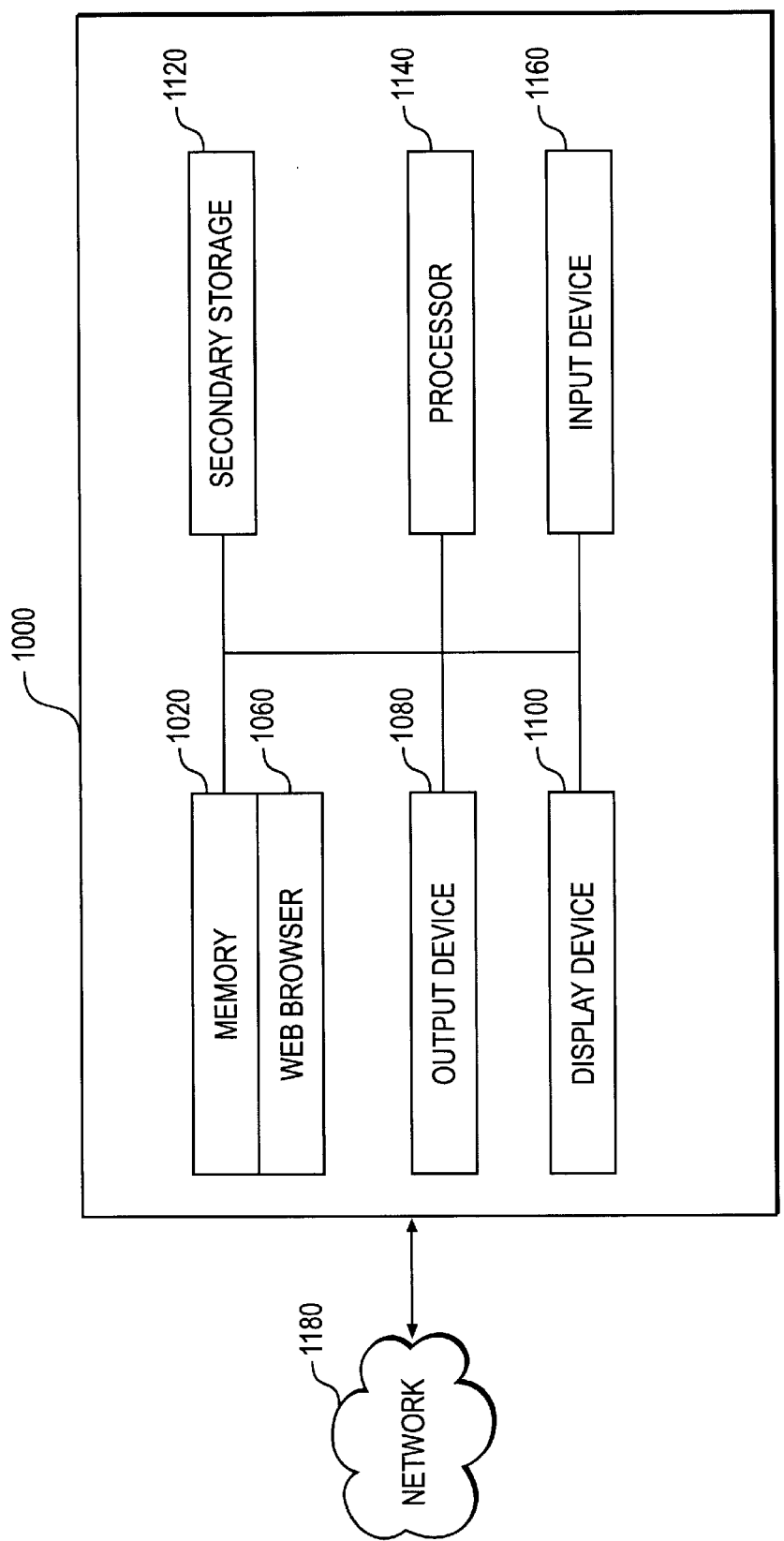
FIG. 10 illustrates exemplary hardware components of a computer that may be used to in connection with the improved load sensitivity modeling in the exemplary minimal level sensitive timing abstraction model.

FIG. 10 illustrates exemplary hardware components of a computer 1000 that may be used to in connection with the improved load sensitivity modeling in an exemplary minimal level sensitive timing abstraction model. The computer 1000 includes a connection with a network 1180 such as the Internet or other type of computer or telephone networks. The computer 1000 typically includes a memory 1020, a secondary storage device 1120, a processor 1140, an input device 1160, a display device 1100, and an output device 1080.

The memory 1020 may include random access memory (RAM) or similar types of memory. The memory 1020 may be connected to the network 1180 by a web browser 1060. The web browser 1060 makes a connection by way of the world wide web (WWW) to other computers, and receives information from the other computers that is displayed on the computer 1000. Information displayed on the computer 1000 is typically organized into pages that are constructed using specialized language, such as HTML or XML. The secondary storage device 1120 may include a hard disk drive, floppy disk drive, CD-ROM drive, or other types of non-volatile data storage, and may correspond with various databases or other resources. The processor 1140 may execute information stored in the memory 1020, the secondary storage 1120, or received from the Internet or other network 1180. The input device 1160 may include any device for entering data into the computer 1000, such as a keyboard, key pad, cursor-control device, touch-screen (possibly with a stylus), or microphone. The display device 1100 may include any type of device for presenting visual image, such as, for example, a computer monitor, flat-screen display, or display panel. The output device 1080 may include any type of device for presenting data in hard copy format, such as a printer, and other types of output devices include speakers or any device for providing data in audio form. The computer 1000 can possibly include multiple input devices, output devices, and display devices.

Although the computer 1000 is depicted with various components, one skilled in the art will appreciate that the computer 1000 can contain additional or different components. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or ROM. The computer-readable media may include instructions for controlling the computer 1000 to perform a particular method.

While the method for modeling circuit environmental sensitivity of a minimal level sensitive timing abstraction model has been described in connection with an exemplary embodiment, those skilled in the art will understand that many modifications in light of these teachings are possible, and this application is intended to cover any variations thereof.

What is claimed is:

1. A method for providing improved load sensitivity modeling in a minimal level sensitive timing abstraction model modeling, comprising:
   extracting a plurality of parameters from a circuit that includes an input port and an output port;
   creating an echo-circuit that represents the plurality of parameters and models load sensitivity, wherein the echo-circuit is stimulus independent, port-based, has no internal latch nodes, and includes a check node at the input port and a dummy latch node at the output port, wherein the dummy latch nodes is controlled by an internally generated clock signal that becomes active when a latest clock signal from the circuit arrives at the output port, and wherein the echo-circuit enables a signal to propagate from the input port to the output port only if the signal arrives at the output port later than a latest clock signal from any pin clock signal controlling the output port; and
   splitting the check node at the input port into multiple check nodes, wherein the multiple check nodes correspond to multiple input logic elements.

2. The method of claim 1, wherein the extracting the plurality of parameters step includes extracting a required time parameter associated with a setup check node.

3. The method of claim 1, wherein the extracting the plurality of parameters step includes extracting a required time parameter associated with a hold check node.

4. The method of claim 1, wherein the extracting the plurality of parameters step includes extracting a transparent delay arc parameter that represents a delay a signal passes from an input port to an output port of the circuit.

5. The method of claim 1, further comprising attaching multiple input delay factors to the multiple check nodes.

6. The method of claim 1, further comprising splitting the dummy latch node at the output port into multiple dummy latch nodes, wherein the multiple dummy latch nodes correspond to multiple output logic elements.

7. The method of claim 6, further comprising attaching multiple output delay factors to the multiple dummy latch nodes.

8. The method of claim 6, further comprising attaching multiple output slope factors to the multiple dummy latch nodes.

9. A method for providing improved load sensitivity modeling in a minimal level sensitive timing abstraction model modeling, comprising:
   extracting a plurality of parameters from a circuit that includes an input port and an output port;
   creating an echo-circuit that represents the plurality of parameters and models load sensitivity, wherein the echo-circuit is stimulus independent, port-based, has no internal latch nodes, and includes a check node at the input port and a dummy latch node at the output port, wherein the dummy latch nodes is controlled by an internally generated clock signal that becomes active when a latest clock signal from the circuit arrives at the output port, and wherein the echo-circuit enables a signal to propagate from the input port to the output port only if the signal arrives at the output port later than a latest clock signal from any pin clock signal controlling the output port; and
   splitting the dummy latch node at the output port into multiple dummy latch nodes, wherein the multiple dummy latch nodes correspond to multiple output logic elements.

10. The method of claim 9, wherein the extracting the plurality of parameters step includes extracting a required time parameter associated with a setup check node.

11. The method of claim 9, wherein the extracting the plurality of parameters step includes extracting a required time parameter associated with a hold check node.

12. The method of claim 9, further comprising attaching multiple output delay factors to the multiple dummy latch nodes.

13. The method of claim 9, further comprising attaching multiple output slope factors to the multiple dummy latch nodes.

14. A computer readable medium providing instructions for providing improved load sensitivity modeling in a minimal level sensitive timing abstraction model, the instructions comprising:

extracting a plurality of parameters from a circuit that includes an input port and an output port;

creating an echo-circuit that represents the plurality of parameters and models load sensitivity, wherein the echo-circuit is stimulus independent, port-based, has no internal latch nodes, and includes a check node at the input port and a dummy latch node at the output port, wherein the dummy latch nodes is controlled by an internally generated clock signal that becomes active when a latest clock signal from the circuit arrives at the output port, and wherein the echo-circuit enables a signal to propagate from the input port to the output port only if the signal arrives at the output port later than a latest clock signal from any pin clock signal controlling the output port; and splitting the check node at the input port into multiple check nodes, wherein the multiple check nodes correspond to multiple input logic elements.

15. The computer readable medium of claim 14, further comprising instructions for attaching multiple input delay factors to the multiple check nodes.

16. The computer readable medium of claim 14, further comprising instructions for splitting the dummy latch node at the output port into multiple dummy latch nodes, wherein the multiple dummy latch nodes correspond to multiple output logic elements.

17. The computer readable medium of claim 16, further comprising instructions for attaching multiple output delay factors to the multiple dummy latch nodes.

18. The computer readable medium of claim 16, further comprising instructions for attaching multiple output slope factors to the multiple dummy latch nodes.

* * * * *